United States Patent
Sakamoto et al.

(10) Patent No.: US 9,279,070 B2
(45) Date of Patent: Mar. 8, 2016

(54) ANISOTROPIC CONDUCTIVE ADHESIVE, METHOD OF PRODUCING THE SAME, CONNECTION STRUCTURE AND PRODUCING METHOD THEREOF

(75) Inventors: Jun Sakamoto, Tochigi (JP); Misao Konishi, Tochigi (JP)

(73) Assignee: DEXERIALS CORPORATION, Tokyo (JP)

(*) Notice: Subject to any disclaimer, the term of this patent is extended or adjusted under 35 U.S.C. 154(b) by 125 days.

(21) Appl. No.: 13/703,962

(22) PCT Filed: Jun. 28, 2011

(86) PCT No.: PCT/JP2011/064796
§ 371 (c)(1),
(2), (4) Date: Dec. 13, 2012

(87) PCT Pub. No.: WO2012/005144
PCT Pub. Date: Jan. 12, 2012

(65) Prior Publication Data
US 2013/0087373 A1    Apr. 11, 2013

(30) Foreign Application Priority Data
Jul. 6, 2010 (JP) .................................. 2010-153825

(51) Int. Cl.
*C09J 9/02* (2006.01)
*H05K 1/02* (2006.01)
(Continued)

(52) U.S. Cl.
CPC ... *C09J 9/02* (2013.01); *C08K 3/08* (2013.01); *C09J 11/00* (2013.01); *C09J 11/04* (2013.01);
(Continued)

(58) Field of Classification Search
USPC ........ 174/257; 156/325; 252/500, 513, 518.1; 428/343, 413
See application file for complete search history.

(56) References Cited

U.S. PATENT DOCUMENTS

| 6,011,307 A | 1/2000 | Jiang et al. |
| 7,001,645 B1 * | 2/2006 | Texier ............... H01F 41/16 118/324 |

(Continued)

FOREIGN PATENT DOCUMENTS

| CN | 1557000 A | 12/2004 |
| CN | 101346777 | 1/2009 |

(Continued)

OTHER PUBLICATIONS

Saito et al. (JP 04-030532, an IDS reference) English text translation completed by The McElroy Translation Company in Sep. 2014, pp. 1-15, attached as a PDF.*

(Continued)

*Primary Examiner* — Harold Pyon
*Assistant Examiner* — Katie L Hammer
(74) *Attorney, Agent, or Firm* — Oliff PLC

(57) ABSTRACT

In an anisotropic conductive adhesive including a magnetic powder such as nickel-coated resin particles used as conductive particles, the conductive particles are present in an insulating adhesive composition without being aggregated. The magnetic powder used as the conductive particles is at least partially composed of a magnetic material. In this case, demagnetization has been performed on the conductive particles in a powder form that have not been dispersed in the insulating adhesive composition, the conductive particles in a paste obtained by dispersing the conductive particles in the insulating adhesive composition, or the conductive particles in a film formed from the paste, before establishment of an anisotropic conductive connection using the anisotropic conductive adhesive.

14 Claims, 4 Drawing Sheets

(51) Int. Cl.
*H01B 1/22* (2006.01)
*C08K 3/08* (2006.01)
*C09J 11/00* (2006.01)
*C09J 11/04* (2006.01)
*C08K 9/02* (2006.01)

(52) U.S. Cl.
CPC ............... *H01B 1/22* (2013.01); *H05K 1/0213* (2013.01); *C08K 9/02* (2013.01); *C08K 2003/0862* (2013.01)

(56) References Cited

U.S. PATENT DOCUMENTS

| | | | |
|---|---|---|---|
| 2003/0144381 | A1 | 7/2003 | Mizuta et al. |
| 2007/0102663 | A1* | 5/2007 | Xiao .................... B82Y 25/00 252/62.51 C |
| 2007/0145585 | A1* | 6/2007 | Jun et al. ..................... 257/737 |
| 2009/0068916 | A1 | 3/2009 | Jang et al. |
| 2010/0065303 | A1 | 3/2010 | Ishimatsu |

FOREIGN PATENT DOCUMENTS

| | | |
|---|---|---|
| JP | A-59-182502 | 10/1984 |
| JP | A-2-240830 | 9/1990 |
| JP | A-04-030532 | 2/1992 |
| JP | A-4-108710 | 4/1992 |
| JP | A-9-275005 | 10/1997 |
| JP | A-2001-262110 | 9/2001 |
| JP | A-2003-168323 | 6/2003 |
| JP | A-2009-522716 | 6/2009 |
| JP | A-2009-259787 | 11/2009 |
| JP | A-2010-73681 | 4/2010 |
| JP | A-2010-135255 | 6/2010 |
| TW | I232467 | 5/2005 |

OTHER PUBLICATIONS

International Preliminary Report on Patentability issued in International Patent Application No. PCT/JP2011/064796 dated Aug. 16, 2012 (with translation).
Korean Office Action dated Apr. 24, 2014 issued in Korean Patent Application No. 2013-7000275 (with translation).
Office Action dated Jun. 10, 2014 issued in Taiwanese Patent Application No. 100123484 (with English translation).
Chinese Office Action dated Jun. 27, 2014 issued in Chinese Patent Application No, 201180032362.3 (with translation).
Jan. 14, 2014 Office Action issued in Japanese Patent Application No. 2010-153825 (with translation).
International Search Report issued in International Patent Application No. PCT/JP2011/064796 dated Sep. 13, 2011.
Jan. 22, 2015 Office Action issued in Taiwanese Patent Application No. 100123484 (with translation).
Apr. 14, 2015 Office Action issued in Chinese Patent Application No. 201180032362.3.
Notice of Grounds for Rejection dated Oct. 17, 2014 from Korean Patent Application No. 2013-7000275 (with English-language translation).
Oct. 19, 2015 Office Action issuesd in Chinese Patent Application No. 201180032362.3.
Aug. 20, 2015 Extended European Search Report issued in European Patent Application No. 11803479.2.

* cited by examiner

pleted.

ANISOTROPIC CONDUCTIVE ADHESIVE, METHOD OF PRODUCING THE SAME, CONNECTION STRUCTURE AND PRODUCING METHOD THEREOF

TECHNICAL FIELD

The present invention relates to an anisotropic conductive adhesive including a magnetic powder, as conductive particles, dispersed in an insulating resin composition.

BACKGROUND ART

An anisotropic conductive film is produced by dispersing conductive particles in an insulating adhesive and forming the resultant adhesive into a film shape. In such a production process, since the pitch of wiring lines is being reduced, conductive particles having smaller diameters are being used. In addition, resin particles coated with a nickel plating coating (hereinafter referred to as nickel-coated resin particles) are widely used because they have conductivity and deformability suitable for anisotropic conductive connection and are available at relatively low cost (Patent Literature 1).

CITATION LIST

Patent Literature

Patent Literature 1: Japanese Patent Application Laid-Open No. 2009-259787

SUMMARY OF THE INVENTION

Problems to be Solved by the Invention

However, when an anisotropic conductive film using conductive particles at least partially composed of a magnetic material, for example, nickel particles or nickel-coated resin particles, is used to establish an anisotropic conductive connection between a semiconductor chip and a circuit board, the insulating adhesive component melts and flows during the process of anisotropic conductive connection, and therefore also the conductive particles easily move. This results in a problem in that aggregation of the magnetic conductive particles occurs. The occurrence of aggregation of the conductive particles causes localization of the conductive particles, and the risk of conduction failure or a short circuit increases.

It is an object of the present invention to solve the foregoing problem in the conventional technology. More specifically, an object of the invention is to, when a paste-like or film-like anisotropic conductive adhesive that uses conductive particles, for example, nickel-coated resin particles, at least partially composed of a magnetic material is used to establish an anisotropic conductive connection, prevent the occurrence of aggregation of the conductive particles in the anisotropic conductive adhesive.

Means for Solving the Problems

The present inventors have found that the above object can be achieved by demagnetizing the conductive particles, for example, nickel-coated resin particles, at least partially composed of a magnetic material and to be added to the anisotropic conductive adhesive before the anisotropic conductive adhesive is used to establish an anisotropic conductive connection. More specifically, the present inventors have found that the above object can be achieved by using conductive particles demagnetized in any of the following manners: demagnetizing the conductive particles in a powder form that have not been dispersed in an insulating adhesive composition; demagnetizing the conductive particles in a paste prepared by dispersing them in the insulating adhesive composition; and demagnetizing the conductive particles in a film formed from the paste. Thus, the invention has been completed.

Accordingly, the present invention provides an anisotropic conductive adhesive including an insulating adhesive composition and magnetic conductive particles dispersed therein, wherein the magnetic conductive particles have been subjected to demagnetization before establishment of an anisotropic conductive connection using the anisotropic conductive adhesive.

The present invention also provides a method of producing the above-described anisotropic conductive adhesive including the insulating adhesive composition and the magnetic conductive particles dispersed therein, the method including demagnetizing the magnetic conductive particles before the anisotropic conductive adhesive is used to establish an anisotropic conductive connection.

The present invention also provides a connection structure including a first electronic component having a terminal, a second electronic component having a terminal, and the above-described anisotropic conductive adhesive, wherein an anisotropic conductive connection between the terminal of the first electronic component and the terminal of the second electronic component has been established using the anisotropic conductive adhesive.

The present invention also provides a method of producing a connection structure in which a terminal of a first electronic component and a terminal of a second electronic component has been connected, the method including: disposing the above-described anisotropic conductive adhesive between the terminal of the first electronic component and the terminal of the second electronic component; and pressing the first electronic component against the second electronic component while the anisotropic conductive adhesive is heated to thereby establish an anisotropic conductive connection between the terminals.

Advantageous Effects of the Invention

In the anisotropic conductive adhesive of the invention that uses magnetic conductive particles; the magnetic conductive particles used have been demagnetized before establishment of an anisotropic conductive connection using the anisotropic conductive adhesive. Therefore, when an anisotropic conductive connection is established, aggregation of the magnetic conductive particles can be prevented or significantly suppressed. According to the present invention, the connection reliability and insulation reliability of the anisotropic conductive adhesive using the magnetic conductive particles can be improved.

DESCRIPTION OF EMBODIMENTS

Figure 1:
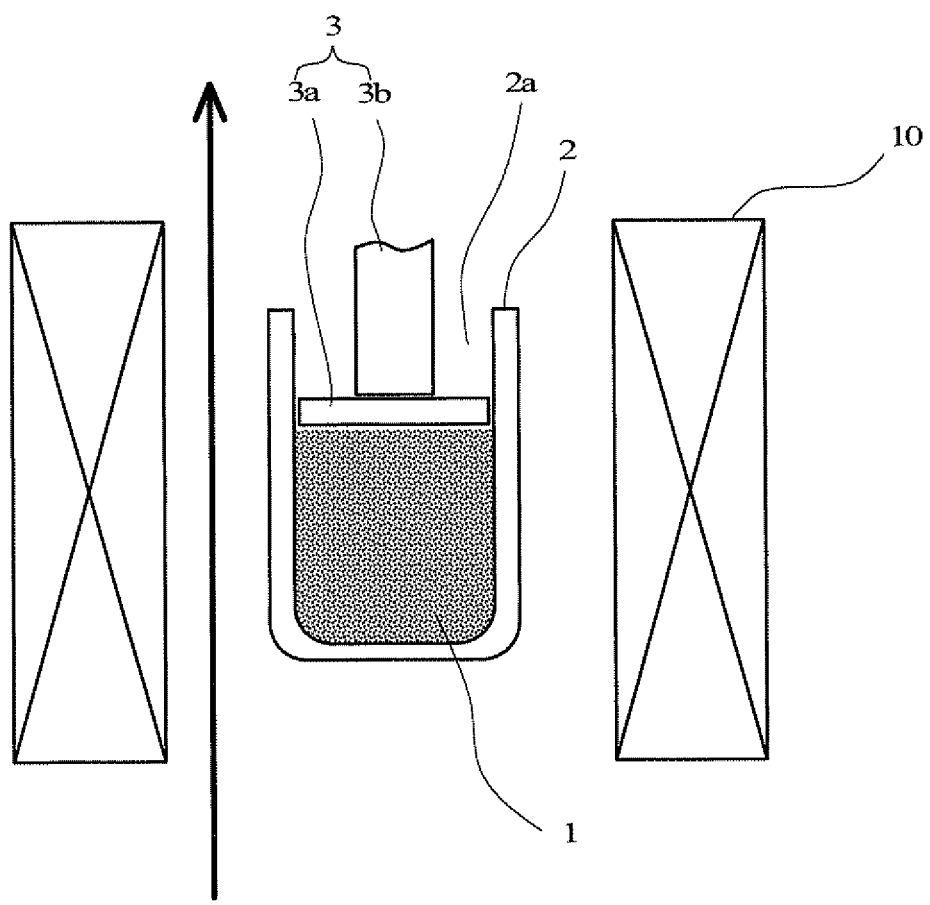
FIG. 1 is a diagram illustrating a demagnetization method that can be preferably used in the present invention.

The present invention will next be described in detail.
The anisotropic conductive adhesive of the present invention includes an insulating adhesive composition and magnetic conductive particles dispersed therein. The feature of the anisotropic conductive adhesive is that the magnetic conductive particles used have been demagnetized before establishment of an anisotropic conductive connection using the anisotropic conductive adhesive.

(Magnetic Conductive Particles Constituting Anisotropic Conductive Adhesive)

The magnetic conductive particles used in the present invention are magnetizable conductive particles at least partially composed of a magnetic material, as described above. Therefore, the magnetic conductive particles may have been magnetized or demagnetized. Examples of such magnetic conductive particles include not only conductive particles formed entirely of a single magnetic material, but also particles prepared by forming a thin film of a magnetic material on the surfaces of conductive particles or insulating particles, particles prepared by forming a non-magnetic metal film on the above-described magnetic thin film, and particles prepared by forming a thin film of a non-magnetic insulating resin on the outermost surfaces of any of the above magnetic powders.

Specific examples of the magnetic powder that can be used as the magnetic conductive particles include: powders of magnetic metals and magnetic alloys such as nickel, iron, iron oxide, chromium oxide, ferrite, cobalt, and sendust; a powder such as metal-coated resin particles prepared by forming a thin film of a magnetic material on the surfaces of non-magnetic conductive particles such as solder or copper particles or insulating resin core particles; a powder prepared by further forming a gold-plating thin film on the surfaces of any of the above particles; and a powder prepared by coating any of the above particles with an insulating resin layer.

Of these, nickel-coated resin particles are preferably used as the magnetic conductive particles for anisotropic conductive connection, in consideration of production cost, deformability under heating and pressurization during the process of connection. No particular limitation is imposed on the resin used as cores. However, inorganic and organic materials having heat resistance and chemical resistance can be preferably used.

For example, to suppress aggregation of nickel particles used as the magnetic material constituting the magnetic conductive particles, elemental phosphorus is added to nickel when the nickel particles are produced. In this case, the amount of elemental phosphorus added is more than 0% by mass, preferably 1% by mass or more, and more preferably 4% by mass or more. If the amount of elemental phosphorus in nickel is excessively large, a high-resistance connection is formed. Therefore, the amount of elemental phosphorus is preferably 10% by mass or less, and more preferably 8% by mass or less. The elemental phosphorus in nickel is generally originated from a phosphate compound, a phosphite compound, etc. used to control the pH in a nickel plating bath, but this is not a limitation.

If the average particle diameter of the magnetic conductive particles used in the present invention is excessively small, the ratio of the amount of the magnetic metal to the total amount of the magnetic conductive particles becomes high, and the magnetic conductive particles are easily affected by magnetism. Therefore, aggregated clusters of the magnetic conductive particles tend to be generated, and a short circuit may occur. In addition, the anisotropic conduction function of the conductive particles deteriorates, and the anisotropic conductive adhesive may not be used for electric components having terminals with large variations in height, so that a problem with connection reliability tends to occur. If the average particle diameter of the magnetic conductive particles is excessively large, such conductive particles tend to cause deterioration in insulation between wiring lines, and the anisotropic conductive adhesive may not be used for fine-pitch connection. Therefore, the average particle diameter of the magnetic conductive particles is preferably 0.5 to 30 μm, and more preferably 1 to 10 μm.

No particular limitation is imposed on a method of demagnetizing the magnetic conductive particles, and any publicly known conventional demagnetization method may be used. Particularly, since fine magnetic conductive particles used for anisotropic conductive connection easily move when a magnetic field for demagnetization changes, the demagnetization efficiency of such particles tends to deteriorate. Therefore, when such magnetic conductive particles are demagnetized, it is preferable that the magnetic conductive particles be subjected to demagnetization with the relative positional relationship between the magnetic conductive particles prevented from being changed. The method described below can be preferably used for demagnetization with the relative positional relationship between the magnetic conductive particles prevented from being changed.

(Demagnetization Method Used for Demagnetization of Magnetic Conductive Particles)

Various demagnetization methods can be used in the present invention to demagnetize the magnetic conductive particles before the anisotropic conductive adhesive is used to establish an anisotropic conductive connection. Preferred examples of such methods include a method in which, before the anisotropic conductive adhesive is used to establish an anisotropic conductive connection, demagnetization is performed with the relative positional relationship between the magnetic conductive particles prevented from being changed. The phrase "with the relative positional relationship between the magnetic conductive particles prevented from being changed" means that the magnetic field applied during demagnetization of the magnetic conductive particles causes substantially no relative positional change between the magnetic conductive particles and almost no rotation of the magnetic conductive particles so that the advantageous effects of the invention are not greatly impaired. In other words, so long as the advantageous effects of the invention are not greatly impaired, the relative positional relationship between the magnetic conductive particles may be slightly changed during demagnetization.

The methods of demagnetizing the magnetic conductive particles with the above state maintained can be broadly classified into a method in which the magnetic conductive particles in a powder form are demagnetized and a method in which the magnetic conductive particles in a paste or a film are demagnetized. Examples of the method of demagnetizing the particles in a powder form include the following first and second modes. Examples of the method of demagnetizing the particles in a paste include the following third mode, and examples of the method of demagnetizing the particles in a film include the following fourth mode. The first, second, third, and fourth modes of the demagnetization method (demagnetization) will next be described in more detail. Any publicly known demagnetization technique can be used.

<First Mode of Demagnetization Method>

In the first mode, the magnetic conductive particles in a powder form are subjected to demagnetization. The powder form means a powder before dispersion in the insulating adhesive composition.

In the first mode, for example, the magnetic conductive particles are charged into a container, and these magnetic conductive particles in a powder form are subjected to demagnetization. More specifically, as shown in FIG. 1, in the first mode, the magnetic conductive particles 1 are placed in a container 2 having an opening 2a and then pressed by pressing means 3 inserted into the container 2 through the opening 2a of the container 2 to temporarily fix the magnetic conductive particles in the container 2. The container 2 is moved away from a demagnetization coil 10 at least once in the direction indicated by an arrow in a demagnetization magnetic field generated by the demagnetization coil 10 while the intensity of the magnetic field is attenuated, whereby the magnetic conductive particles in the powder form are demagnetized. To improve the efficiency of demagnetization, the container 2 may be reciprocated (moved a plurality of times). The container 2 is not limited to a container having an opening, and this method can also be preferably used when the magnetic conductive particles are charged into a container and then the opening is vacuum sealed.

The container that can be used in the first mode of the demagnetization method and the second and third modes of the demagnetization method described later is formed of a non-magnetic material, a material having low magnetic permeability, etc. Examples of such a container include a glass container, an alumina container, and a porcelain container. The container has preferably a tubular shape and particularly preferably a cylindrical shape but may have a polygonal tubular shape. The bottom of the container is preferably rounded. The bottom may be openable.

No particular limitation is imposed on the pressing means 3. For example, the pressing means 3 may be configured such that a pusher 3b presses a hard or elastic flat plate 3a. The level of pushing is set such that the magnetic powder to be demagnetized is not damaged and the movement of the magnetic powder can be suppressed during demagnetization. The level of pushing can be determined according to the type, size, and shape of the magnetic powder, the conditions for demagnetization, etc.

<Second Mode of Demagnetization Method>

In the second mode, the magnetic conductive particles in a powder form are subjected to demagnetization, but the second mode is different from the first mode. The powder form means a powder before dispersion in the insulating adhesive composition.

Figure 2:
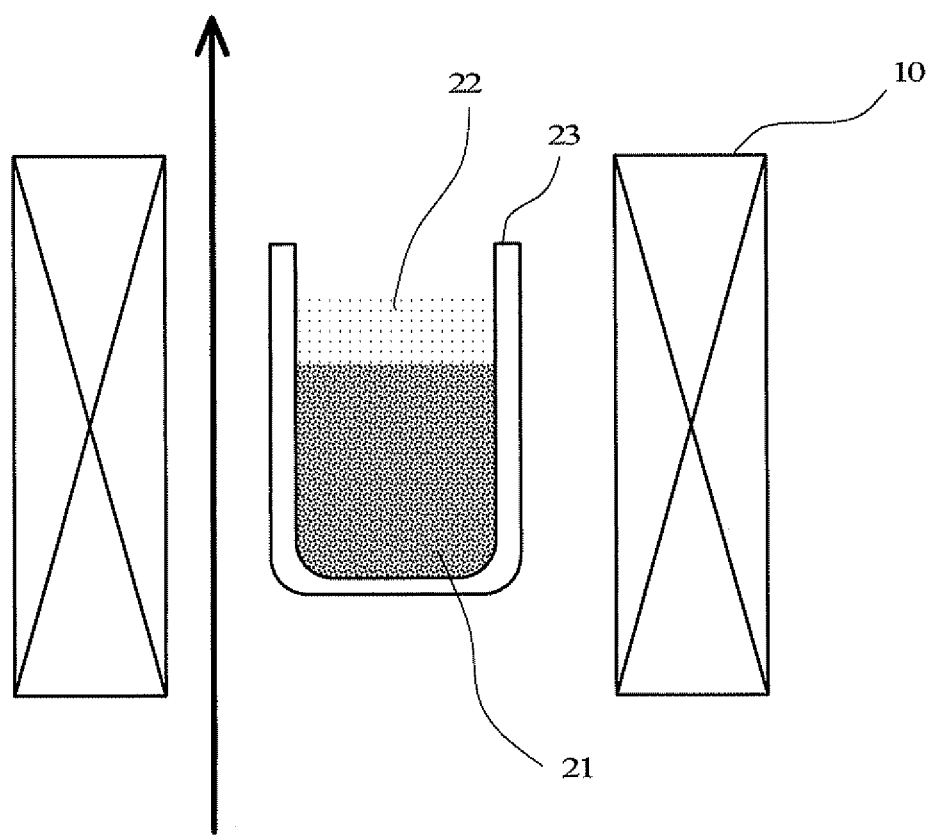
FIG. 2 is a diagram illustrating another demagnetization method that can be preferably used in the present invention.

More specifically, as shown in FIG. 2, in the second mode, the magnetic conductive particles 21 are added to a liquid 22 contained in a container 23. Then the liquid 22 is solidified to temporarily fix the magnetic conductive particles 21 in the solidified liquid, and the container 23 is moved away from a demagnetization coil 10 at least once in the direction indicated by an arrow in a demagnetization magnetic field generated by the demagnetization coil 10 while the intensity of the magnetic field is attenuated. The magnetic conductive particles in the powder form are thereby demagnetized. To improve the efficiency of demagnetization, the container 23 may be reciprocated (moved a plurality of times). Even when the magnetic conductive particles in the solidified liquid 22 are demagnetized as described above, the magnetic conductive particles are not dispersed in the insulating adhesive composition. Therefore, the magnetic conductive particles are considered to be demagnetized in a powder form because the magnetic conductive particles return to their original state after the solidified liquid is melted.

In the second mode, the liquid is generally solidified in the container 23, but the container may be removed during demagnetization after solidification.

In the second mode of the demagnetization method in the present invention, it is preferable that, after the magnetic conductive particles are added to the liquid, the liquid be degassed and then solidified. This is because, if the liquid is not degassed, bubbles are introduced into the solidified liquid when the liquid is solidified and magnetic conductive particles in the vicinity of the bubbles can easily move.

One specific method of solidifying the liquid is to solidify the liquid by cooling it to lower than its freezing point. Any of water, alcohols such as ethanol, alkanes such as hexane and cyclohexane, aryls such as toluene and naphthalene, etc. can be used as the liquid. One specific example of solidification when water is used as the liquid is to cool the liquid to 0° C. or lower to solidify the liquid. When cyclohexane (melting point: 7° C.) is used, the liquid is cooled to 7° C. or lower and preferably −10° C. In this case, after demagnetization, the solidified liquid is left to stand or heated until the temperature of the solidified liquid becomes its freezing point or higher, and the demagnetized magnetic conductive particles are separated from the liquid by a routine method.

In another method of solidifying the liquid, a solidifying agent that can solidify the liquid is added to the liquid, and the liquid is solidified with the aid of the solidifying agent after the magnetic powder is added. For example, in this method, a gelling agent for the liquid is used as the solidifying agent. More specifically, when the liquid is water, gelatin is used as the solidifying agent, and the gelatin is dissolved in water under heating. Then the magnetic powder is added thereto, and degassing treatment is preformed if necessary. Then the mixture is cooled to allow it to gelate. In this case, the gel originating from gelatin disappears when heated, and this phenomenon is reversible. Therefore, after demagnetization, the solidified liquid is heated at a temperature at which the gel disappears, and the demagnetized magnetic conductive particles are separated from the liquid by a routine method.

<Third Mode of Demagnetization Method>

In the third mode, the magnetic conductive particles in a paste are subjected to demagnetization. The magnetic conductive particles in a paste mean that they have been dispersed in the insulating adhesive composition to form the paste.

Figure 3:
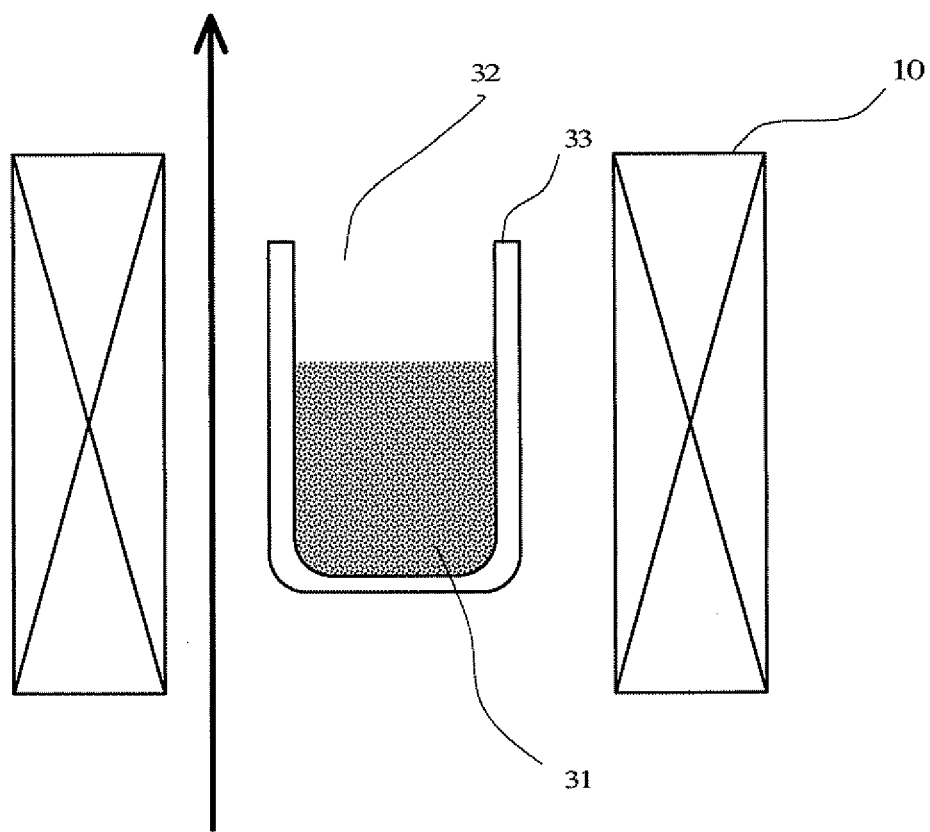
FIG. 3 is a diagram illustrating another demagnetization method that can be preferably used in the present invention.

More specifically, as shown in FIG. 3, in the third mode, the paste 31 prepared by dispersing the magnetic conductive particles in the insulating adhesive composition is placed in a container 33 having an opening 32, and then the opening 32 of the container 33 is covered with a cap, if necessary. The container 33 is moved away from a demagnetization coil 10 at least once in the direction indicated by an arrow in a magnetic field generated by the demagnetization coil 10 while the intensity of the magnetic field is attenuated, whereby the magnetic conductive particles in the paste are demagnetized. To improve the efficiency of demagnetization, the container 33 may be reciprocated (moved a plurality of times).

In the third mode, if the viscosity of the insulating adhesive composition after the magnetic conductive particles are added thereto is too low, the movement of the magnetic conductive particles is not sufficiently suppressed. If the viscosity is too high, the magnetic conductive particles tend to be difficult to be dispersed. Therefore, the viscosity is preferably 1 Pa·s to 10,000 Pa·s.

No particular limitation is imposed on a method of dispersing the magnetic conductive particles in the insulating adhesive composition, and any publicly known dispersing method can be used.

<Fourth Mode of Demagnetization Method>

In the fourth mode, the magnetic conductive particles in a film are subjected to demagnetization. The magnetic conductive particles in a film mean that they have been dispersed in the insulating adhesive composition and the dispersion has been formed into a film by any publicly known method.

Figure 4:
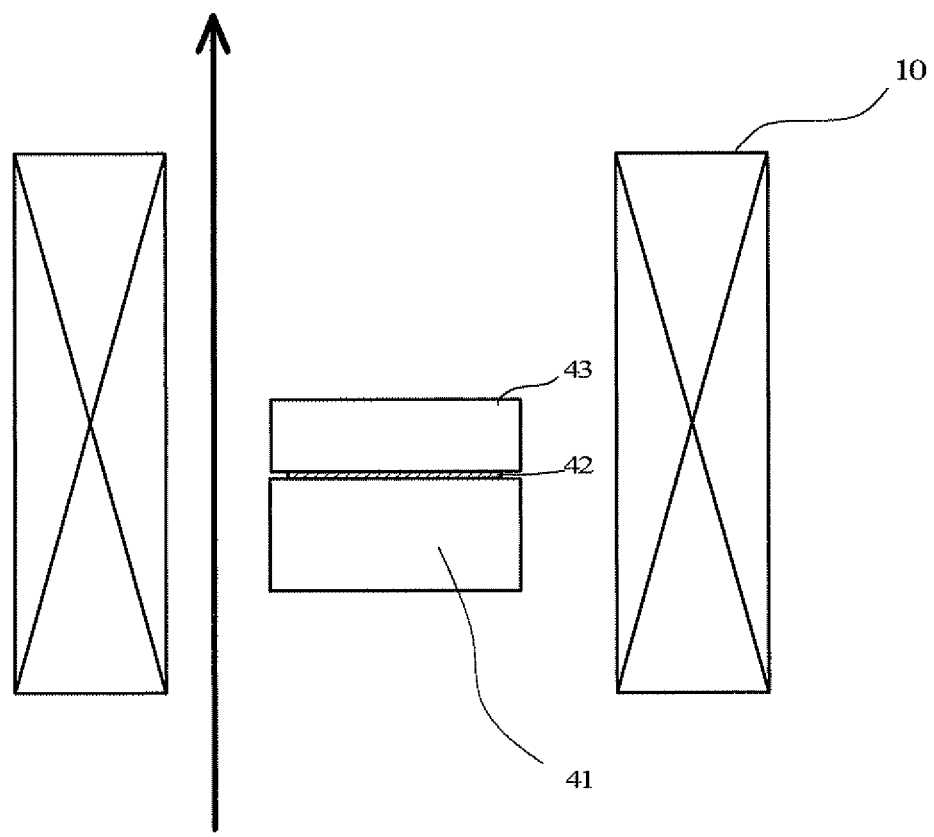
FIG. 4 is a diagram illustrating another demagnetization method that can be preferably used in the present invention.

More specifically, as shown in FIG. 4, in the fourth mode, a sheet of an anisotropic conductive film 42 is placed on a non-magnetic base 41 and is pressed with a non-magnetic cover 43 from above. Then the anisotropic conductive film 42 is moved away from a demagnetization coil 10 at least once in the direction indicated by an arrow in a magnetic field generated by the demagnetization coil 10 while the intensity of the magnetic field is attenuated, whereby the magnetic conductive particles in the film are demagnetized. In this case, an anisotropic conductive film wound around a reel may be used instead of the sheet of the anisotropic conductive film. To improve the efficiency of demagnetization, the container 33 may be reciprocated (moved a plurality of times).

If the intensity of the magnetic field during demagnetization using each of the above-described first to fourth modes of the demagnetization method is too low, the effects of demagnetization are not obtained, and the conductive particles may aggregate. If the intensity of the magnetic field is too high, the conductive particles may be magnetized. Therefore, the suitable range of the intensity of the magnetic field used is 100 to 2,000 G, and the intensity of the magnetic field is preferably 200 to 2,000 G, and more preferably 200 to 400 G.

If the demagnetization rate during demagnetization using the demagnetization method in any of the configurations in FIGS. 1 to 4 is too low, production efficiency tends to be reduced. If the demagnetization rate is too high, magnetic efficiency is difficult to be obtained. Therefore, the demagnetization rate is preferably 0.1 to 100 mm/s, more preferably 1 to 100 mm/s, and still more preferably 1 to 50 mm/s.

If the amount of the demagnetized magnetic conductive particles described above contained in the anisotropic conductive adhesive is too low, connection reliability becomes insufficient. If the amount is too high, anisotropy disappears. Therefore, the amount of the demagnetized magnetic conductive particles is preferably 1 to 100 parts by mass and more preferably 2 to 70 parts by mass based on 100 parts by mass of all the components (a monomer, an oligomer, a non-polymerizable polymer, a curing agent, etc.) used as film-forming components in the insulating adhesive composition after curing.

(Insulating Adhesive Composition Constituting Anisotropic Conductive Adhesive)

The insulating adhesive composition constituting the anisotropic conductive adhesive of the present invention can be appropriately selected from thermosetting binder resin compositions used for conventional anisotropic conductive adhesives. Examples of the insulating adhesive composition used include a composition prepared by adding a curing agent such as an imidazole-based or amine-based curing agent to a thermosetting epoxy resin, a thermosetting urea resin, a thermosetting melamine resin, a thermosetting phenol resin, etc. Particularly, an insulating adhesive composition prepared using a thermosetting epoxy resin as a binder resin can be preferably used, in consideration of its high bonding strength after curing.

Such a thermosetting epoxy resin may be in a liquid form or a solid form. The epoxy equivalent of the thermosetting epoxy resin is generally about 100 to about 4,000, and a thermosetting epoxy resin having at least two epoxy groups in its molecule is preferred. Preferred examples of the thermosetting epoxy resin that can be used include bisphenol-A type epoxy compounds, phenol novolac type epoxy compounds, cresol novolac type epoxy compounds, ester type epoxy compounds, and alicyclic epoxy compounds. These compounds include monomers and oligomers.

If necessary, the insulating adhesive composition may contain a filler such as silica or mica, a pigment, an antistatic agent, etc. In addition, a colorant, a preservative, a polyisocyanate-based crosslinking agent, a silane coupling agent, a solvent, etc. may be added.

(Preparation of Anisotropic Conductive Adhesive)

In the anisotropic conductive adhesive of the present invention, the conductive particles contained therein and formed from a magnetic powder have been subjected to demagnetization by any of the first to fourth modes of the demagnetization method. However, except for the above process, the anisotropic conductive adhesive can be produced using the same method as that used for conventional paste-like or film-like anisotropic conductive adhesives.

The anisotropic conductive adhesive of the present invention can be used in the form of anisotropic conductive paste but can be formed into a film shape using a film-forming technique such as casting.

(Connection Structure)

The anisotropic conductive adhesive of the present invention can be preferably used when an anisotropic conductive connection is established between a terminal of a first electronic component and a terminal of a second electronic component. By establishing the anisotropic conductive connection between the terminal of the first electronic component and the terminal of the second electronic component, a connection structure with the anisotropic conductive connection is obtained. Such a connection structure is also one aspect of the present invention.

Any of the publicly known electric elements such as light-emitting elements, semiconductor chips and semiconductor modules, flexible printed circuit boards, glass circuit boards, glass epoxy boards, etc. can be used as the first electronic component and the second electronic component. The terminals may be traces, electrode pads, or bumps formed of any of the publicly known materials such as copper, gold, aluminum, or ITO, and no particular limitation is imposed on their size.

Specific preferred examples of the connection structure of the present invention include so called COG (chip on glass), COF (chip on film), FOG (film on glass), and FOB (Film on Board) structures.

(Method of Producing Connection Structure)

The above-described connection structure can be produced by disposing the above-described anisotropic conductive adhesive between the terminal of the first electronic component and the terminal of the second electronic component and pressing the first electronic component against the second electronic component while the anisotropic conductive adhesive is heated to thereby establish an anisotropic conductive connection between the terminals. In this case, the pressing can be performed using a metal-made pressing bonder or an elastic bonder. The heating may be performed using heating means provided in a stage on which the first electronic component or the second electronic component is placed or may be performed using a bonder provided with heating means.

EXAMPLES

The present invention will next be specifically described by way of Examples.

Example 1

Demagnetization Using Second Mode of Demagnetization Method (Demagnetization of Conductive Particles)

A chemical-resistant glass cylindrical container having a volume of 900 mL, an opening inner diameter of 10 cm, and a depth of 20 cm was charged with 100 g of nickel-coated resin particles having an average particle diameter of 3 to 4 µm and prepared in a manner described later and further charged with 500 g of cyclohexane, and the mixture was dispersed and mixed.

The cyclohexane mixture was cooled to −40° C. and solidified. The glass container containing the solidified cyclohexane mixture was attached to a penetration-type demagnetizer (a product of Sony Chemical & Information Device Corporation) and subjected to demagnetization under one of the conditions shown in TABLES 1 to 3. After demagnetization, the glass container was brought to room temperature, and the nickel-coated resin particles were separated from cyclohexane by filtration, washed with hexane, and dried to obtain demagnetized conductive particles.

(Preparation of Nickel-Coated Resin Particles)

A palladium catalyst was supported on 3 μm divinylbenzene-based resin particles (5 g) by a dipping method. Then the resin particles were subjected to electroless nickel plating using an electroless nickel plating solution (pH: 12, plating solution temperature: 50° C.) prepared from nickel sulfate hexahydrate, sodium hypophosphite, sodium citrate, triethanolamine, and thallium nitrate. Varied types of nickel-coated resin particles in which various nickel plating layers (metal layers) containing varied amounts of phosphorus were formed on their surfaces were obtained as conductive particles. The average particle diameter of the obtained conductive particles was in the range of 3 to 4 μm.

(Production of Anisotropic Conductive Film)

35 Parts by mass of one type of the demagnetized nickel-coated resin particles used as conductive particles, 30 parts by mass of bisphenol A-type phenoxy resin (YP50, NSCC Epoxy Manufacturing Co., Ltd.) used as a film-forming component, 30 parts by mass of a bisphenol A epoxy compound (EP828, Mitsubishi Chemical Corporation) used as a liquid component, 39 parts by mass of an amine-based curing agent (PHX3941HP, Asahi Kasei Corporation), and 1 part by mass of an epoxysilane coupling agent (A-187, Momentive Performance Materials Inc.) were diluted with toluene such that the amount of solids was 50% by mass and were then mixed to prepare an anisotropic conductive adhesive. The prepared adhesive was applied to a release-treated polyethylene terephthalate film to a dry thickness of 25 μm using a bar coater. The film was dried in an oven at 80° C. for 5 minutes to produce an anisotropic conductive film.

(Production of Connection Structure)

The produced anisotropic conductive film was disposed between ITO electrodes of a glass circuit board and gold bumps (height: 15 μm) formed on an IC chip of 13 mm×1.5 mm and was pressed at 180° C. and 40 MPa for 15 seconds using a flip-chip bonder to obtain a connection structure.

Comparative Example 1

(Production of Anisotropic Conductive Film)

Anisotropic conductive adhesives were prepared as in Example 1 except that non-demagnetized nickel-coated resin particles were used instead of the demagnetized nickel-coated resin particles. Then anisotropic conductive films were produced, and connection structures were also obtained.

(Evaluation)

The "insulating properties" and "connection resistances" of the obtained anisotropic conductive films and connection structures were evaluated as described below under the conditions of varied demagnetization rates (TABLE 1) or under the conditions of varied phosphorus amounts (TABLE 2).

<Insulating Properties>

A short-circuit evaluation insulating TEG (a 13 mm×1.5 mm IC chip having gold bumps (height: 15 μm) formed thereon, bump size: 25×140 μm, space between bumps: 10 μm) having ITO traces arranged in a comb teeth shape on a glass substrate was press-bonded to the bonding surface of each of the anisotropic conductive films in Example 1 and Comparative Example 1 using a bonder under the conditions of an attained temperature of 180° C. and a press bonding time of 15 seconds. Here, the release-treated polyethylene terephthalate film of the film had not been peeled off and removed. The insulation resistance between bumps was measured, and the number of formed short circuits was counted. These were evaluated according to the following evaluation criteria. The results obtained are shown in TABLEs 1 and 2. A place at which a short circuit had occurred was observed under an optical microscope to check the presence or absence of aggregation and the degree of aggregation according to the state of clogging of the conductive particles etc.

Rank Details

A: The number of formed short circuits was less than 10 out of 40 samples.
B: The number of formed short circuits was 10 or more and less than 20 out of 40 samples.
C: The number of formed short circuits was 20 or more out of 40 samples.

<Connection Resistance>

The conduction resistance of each of the connection structures obtained in Example 1 and Comparative Example 1 was measured by a four probe method immediately after production. The results obtained are shown in TABLEs 1 and 2.

Rank Details

A: The connection resistance value was less than 10 Ω.
B: The connection resistance value was 10Ω or higher and less than 50 Ω.
C: The connection resistance value was 50Ω or higher.

TABLE 1

| Comparative Example 1 | | | Example 1 | | | | | |
|---|---|---|---|---|---|---|---|---|
| No Demagnetization | | | Magnetic Field Intensity (G) | | | | | |
| | | | 100 | | 200 | | 400 | |
| Insulating Properties | Connection Resistance | Demagnetization Rate | Insulating Properties | Connection Resistance | Insulating Properties | Connection Resistance | Insulating Properties | Connection Resistance |
| C | A | 0.1 mm/s | B | A | A | A | A | A |
| | | 1.0 mm/s | B | A | A | A | A | A |
| | | 10 mm/s | B | A | A | A | A | A |
| | | 50 mm/s | B | A | A | A | A | A |
| | | 100 mm/s | B | A | A | A | A | A |
| | | 300 mm/s | B | A | B | A | B | A |
| | | 500 mm/s | B | A | B | A | B | A |

TABLE 1-continued

| | Comparative Example 1 | | Example 1 | | | | | |
| | | | Magnetic Field Intensity (G) | | | | | |
| | No Demagnetization | | 1000 | | 2000 | | 3000 | |
| | Insulating Properties | Connection Resistance | Demagnetization Rate | Insulating Properties | Connection Resistance | Insulating Properties | Connection Resistance | Insulating Properties | Connection Resistance |
|---|---|---|---|---|---|---|---|---|---|
| | C | A | 0.1 mm/s | A | A | A | A | A | A |
| | | | 1.0 mm/s | A | A | A | A | A | A |
| | | | 10 mm/s | A | A | A | A | A | A |
| | | | 50 mm/s | A | A | A | A | B | A |
| | | | 100 mm/s | A | A | A | A | B | A |
| | | | 300 mm/s | B | A | B | A | B | A |
| | | | 500 mm/s | B | A | B | A | B | A |

Amount treated: constant (100 g), amount of phosphorus: constant (4%), varied demagnetization rates were used in Example 1.

TABLE 2

| | Comparative Example 1 | | Example 1 | | | | | |
| | | | Magnetic Field Intensity (G) | | | | | |
| | No Demagnetization | | 100 | | 200 | | 400 | |
| Amount of Phosphorus | Insulating Properties | Connection Resistance | Insulating Properties | Connection Resistance | Insulating Properties | Connection Resistance | Insulating Properties | Connection Resistance |
|---|---|---|---|---|---|---|---|---|
| 0% | C | A | B | A | A | A | A | A |
| 1% | C | A | B | A | A | A | A | A |
| 3% | C | A | B | A | A | A | A | A |
| 4% | C | A | B | A | A | A | A | A |
| 8% | B | A | A | A | A | A | A | A |
| 10% | B | B | A | B | A | B | A | B |

| | Example 1 | | | | | |
| | Magnetic Field Intensity (G) | | | | | |
| | 1000 | | 2000 | | 3000 | |
| Amount of Phosphorus | Insulating Properties | Connection Resistance | Insulating Properties | Connection Resistance | Insulating Properties | Connection Resistance |
|---|---|---|---|---|---|---|
| 0% | A | A | A | A | C | A |
| 1% | A | A | A | A | A | A |
| 3% | A | A | A | A | A | A |
| 4% | A | A | A | A | B | A |
| 8% | A | A | A | A | B | A |
| 10% | A | B | A | B | A | B |

Various amounts of phosphorus were used, amount treated: constant (100 g), demagnetization rate in Example 1: constant (50 mm/s)

Overall Evaluation of Example 1 and Comparative Example 1

In Comparative Example 1 in which the non-demagnetized conductive particles were used, the results of evaluation of the insulating properties for varied phosphorus amounts were "C" or "B".

However, in Example 1 in which the demagnetized conductive particles were used, the results of evaluation of the insulating properties for varied demagnetization rates and for varied phosphorus amounts were basically "A" or "B" although the evaluation of the insulating properties was "C" under some extreme conditions. As can be seen from these results, in the anisotropic conductive adhesives and connection structures of the present invention, the conductive particles being magnetic powder used were efficiently demagnetized, and favorable connection reliability and insulation reliability were achieved. Findings about the tendency of demagnetization conditions will next be described.

<Evaluation of Insulating Properties>
(1) For Varied Demagnetization Rates
As can be seen from TABLE 1, as the demagnetization rate increases, the insulating properties tend to deteriorate. However, the degree of deterioration is not large.
(2) For Varied Phosphorus Amounts
As can be seen from the results in TABLE 2, the insulating properties do not deteriorate, so long as the magnetic field intensity is 200 to 2,000 G irrespective of the phosphorus amount. The results of the optical microscopic observation showed that aggregation of the conductive particles was observed in a place at which a "short circuit" had occurred and the degree of aggregation was particularly significant when the evaluation was "C".

<Evaluation of Connection Resistance>
When demagnetization was not performed, the connection resistance value was low. It is desirable that, even when demagnetization is performed, an increase in the connection resistance value do not occur. As can be seen from the column of "connection resistance" in TABLES 1 and 2, a preferred connection resistance value could be maintained even when the demagnetization rate or the phosphorus amount was changed.

Example 2

Demagnetization Using First Mode of Demagnetization Method

A chemical-resistant glass cylindrical container having a volume of 100 mL, an opening inner diameter of 60 mm, and a depth of 70 mm was charged with 100 g of (non-demagnetized) nickel-coated resin particles having an average particle diameter of 3 to 4 μm and prepared as in Example 1. The surfaces of the resin particles were located 20 mm from the opening. The nickel contained 4% by mass of phosphorus atoms.

Next, a disk-shaped glass plate having a diameter of 60 mm and a thickness of 10 mm was inserted from the opening and placed on the surfaces of the resin particles. The glass plate was pressed with a force of 500 N and detachably secured. The glass container was attached to a penetration-type demagnetizer (a product of Sony Chemical & Information Device Corporation) and subjected to demagnetization at a magnetic field intensity of 400 G, a demagnetization rate of 50 mm/s, and room temperature.

Anisotropic conductive adhesives, anisotropic conductive films, and connection structures were produced as in Example 1 except that the conductive particles obtained in this Example were used. The obtained anisotropic conductive films and connection structures were tested and evaluated as in Example 1, and the evaluation results showed the same tendency as in Example 1.

Example 3

Demagnetization Using Third Mode of Demagnetization Method (Preparation of Anisotropic Conductive Adhesive)

35 Parts by mass of one type of the (non-demagnetized) nickel-coated resin particles produced in Example 1, having an average particle diameter of 3 to 4 μm, and used as conductive particles, 30 parts by mass of bisphenol A-type phenoxy resin (YP50, NSCC Epoxy Manufacturing Co., Ltd.) used as a film-forming component, 30 parts by mass of a bisphenol A epoxy compound (EP828, Mitsubishi Chemical Corporation) used as a liquid component, 39 parts by mass of an amine-based curing agent (PHX3941HP, Asahi Kasei Corporation), and 1 part by mass of an epoxysilane coupling agent (A-187, Momentive Performance Materials Inc.) were diluted with toluene such that the amount of solids was 50% by mass and a prescribed viscosity (25° C.) was obtained and were then mixed to prepare a paste-like anisotropic conductive adhesive. The nickel contained 4% by mass of phosphorus atoms.

(Demagnetization of Paste-Like Anisotropic Conductive Adhesive)

The paste-like anisotropic conductive adhesive was placed in a chemical-resistant glass cylindrical container having a volume of 100 mL, an opening inner diameter of 60 mm, and a depth of 70 mm. The surface of the anisotropic conductive adhesive was located 20 mm from the opening.

Next, the glass container was attached to a penetration-type demagnetizer (a product of Sony Chemical & Information Device Corporation) and subjected to demagnetization at a prescribed magnetic field intensity, a demagnetization rate of 50 mm/s, and room temperature. Paste-like anisotropic conductive adhesives containing demagnetized conductive particles were thereby obtained.

Anisotropic conductive films and connection structures were produced as in Example 1 except that the paste-like anisotropic conductive adhesives containing the demagnetized conductive particles and obtained in this Example were used. The obtained anisotropic conductive films and connection structures were tested and evaluated as in Example 1. The results obtained are shown in TABLE 3.

Comparative Example 2

Paste-like anisotropic conductive adhesives were prepared as in Example 3 except that the anisotropic conductive adhesives were not demagnetized. Then anisotropic conductive films were produced, and connection structures were also obtained. The obtained anisotropic conductive films and connection structures were tested and evaluated as in Example 1. The results obtained are shown in TABLE 3.

TABLE 3

| | Comparative Example 2 | | Example 3 Magnetic Field Intensity (G) | | | | | |
|---|---|---|---|---|---|---|---|---|
| | No Demagnetization | | 100 | | 200 | | 400 | |
| Viscosity of Adhesive | Insulating Properties | Connection Resistance | Insulating Properties | Connection Resistance | Insulating Properties | Connection Resistance | Insulating Properties | Connection Resistance |
| 0.1 Pa·s | C | A | C | A | B | A | B | A |
| 0.5 Pa·s | C | A | C | A | B | A | B | A |
| 1 Pa·s | C | A | B | A | A | A | A | A |
| 10 Pa·s | C | A | B | A | A | A | A | A |
| 50 Pa·s | C | A | B | A | A | A | A | A |
| 100 Pa·s | C | A | B | A | A | A | A | A |
| 500 Pa·s | C | A | A | A | A | A | A | A |
| 1000 Pa·s | C | A | A | A | A | A | A | A |
| 10000 Pa·s | C | A | A | A | A | A | A | A |

TABLE 3-continued

| | Example 3 | | | | | |
|---|---|---|---|---|---|---|
| | Magnetic Field Intensity (G) | | | | | |
| | 1000 | | 2000 | | 3000 | |
| Viscosity of Adhesive | Insulating Properties | Connection Resistance | Insulating Properties | Connection Resistance | Insulating Properties | Connection Resistance |
| 0.1 Pa·s | B | A | C | A | C | A |
| 0.5 Pa·s | B | A | B | A | C | A |
| 1 Pa·s | A | A | A | A | B | A |
| 10 Pa·s | A | A | A | A | A | A |
| 50 Pa·s | A | A | A | A | A | A |
| 100 Pa·s | A | A | A | A | A | A |
| 500 Pa·s | A | A | A | A | A | A |
| 1000 Pa·s | A | A | A | A | A | A |
| 10000 Pa·s | A | A | A | A | A | A |

Various adhesive viscosities were used, amount treated: constant (100 g), amount of phosphorus: constant (4%), demagnetization rate in Example 3: constant (50 mm/s)

Overall Evaluation of Example 3 and Comparative Example 2

In Comparative Example 2 in which the non-demagnetized conductive particles were used, the results of evaluation of the insulating properties for varied anisotropic conductive adhesive viscosities were "C". However, in Example 3 in which the conductive particles demagnetized in the paste-like anisotropic conductive adhesive were used, the results of evaluation of the insulating properties for varied adhesive viscosities were basically "A" or "B" although the evaluation of the insulating properties was "C" under some extreme conditions. As can be seen from these results, in the paste-like anisotropic conductive adhesives and connection structures of the present invention, the conductive particles being magnetic powder used were efficiently demagnetized, and favorable connection reliability and insulation reliability were achieved. Findings about the tendency of demagnetization conditions will next be described.

<Evaluation of Insulating Properties>
(1) For Varied Anisotropic Conductive Adhesive Viscosities
As can be seen from TABLE 3, as the viscosity of the adhesive decreases, the insulating properties tend to deteriorate. However, the degree of deterioration is not large. The results of the optical microscopic observation showed that aggregation of the conductive particles was observed in a place at which a "short circuit" had occurred and the degree of aggregation was particularly significant when the evaluation was "C".

<Evaluation of Connection Resistance>
When demagnetization was not performed, the connection resistance value was low. It is desirable that, even when demagnetization is performed, an increase in the connection resistance value do not occur. As can be seen from the column of "connection resistance" in TABLE 3, a preferred connection resistance value could be maintained even when the adhesive composition viscosity was changed. When the amount of phosphorus was changed, the same tendency as in TABLE 2 was observed.

Example 4

Demagnetization Using Fourth Mode of Demagnetization Method (Preparation of Anisotropic Conductive Adhesive)
35 Parts by mass of one type of the (non-demagnetized) nickel-coated resin particles produced in Example 1, having an average particle diameter of 3 to 4 μm, and used as conductive particles, 30 parts by mass of bisphenol A-type phenoxy resin (Y950, NSCC Epoxy Manufacturing Co., Ltd.) used as a film-forming component, 30 parts by mass of a bisphenol A epoxy compound (EP828, Mitsubishi Chemical Corporation) used as a liquid component, 39 parts by mass of an amine-based curing agent (PHX3941HP, Asahi Kasei Corporation), and 1 part by mass of an epoxysilane coupling agent (A-187, Momentive Performance Materials Inc.) were diluted with toluene such that the amount of solids was 50% by mass and were then mixed to prepare an anisotropic conductive adhesive. The nickel contained 4% by mass of phosphorus atoms.

(Production of Anisotropic Conductive Film)
The prepared anisotropic conductive adhesive was applied to a release-treated polyethylene terephthalate film to a dry thickness of 25 μm using a bar coater. The film was dried in an oven at 80° C. for 5 minutes to produce an anisotropic conductive film.

(Demagnetization in Anisotropic Conductive Film)
Next, a stacked body obtained by sandwiching the anisotropic conductive film between a non-magnetic base and a cover was attached to a penetration-type demagnetizer (a product of Sony Chemical & Information Device Corporation) and subjected to demagnetization at a prescribed magnetic field intensity, under varied demagnetization rates, at room temperature. An anisotropic conductive film containing demagnetized conductive particles was thereby obtained.

(Production of Connection Structure)
The produced anisotropic conductive film was disposed between ITO electrodes of a glass circuit board and gold bumps (height: 15 μm) formed on an IC chip of 13 mm×1.5 mm and was pressed at 180° C. and 40 MPa for 15 seconds using a flip-chip bonder to obtain a connection structure.

The obtained anisotropic conductive films and connection structures were tested and evaluated as in Example 1. The results obtained are shown in TABLE 4.

Comparative Example 3

An anisotropic conductive adhesive was prepared as in Example 4 except that non-demagnetized nickel-coated resin particles were used instead of the demagnetized nickel-coated resin particles. Then an anisotropic conductive film was produced, and a connection structure was also obtained. The obtained anisotropic conductive film and connection structure were tested and evaluated as in Example 4. The results obtained are shown in TABLE 4.

TABLE 4

| Comparative Example 3 | | | Example 4 Magnetic Field Intensity (G) | | | | | |
|---|---|---|---|---|---|---|---|---|
| No Demagnetization | | | 100 | | 200 | | 400 | |
| Insulating Properties | Connection Resistance | Demagnetization Rate | Insulating Properties | Connection Resistance | Insulating Properties | Connection Resistance | Insulating Properties | Connection Resistance |
| C | A | 0.1 mm/s | B | A | A | A | A | A |
| | | 1.0 mm/s | B | A | A | A | A | A |
| | | 10 mm/s | B | A | A | A | A | A |
| | | 50 mm/s | B | A | A | A | A | A |
| | | 100 mm/s | B | A | A | A | A | A |
| | | 300 mm/s | B | A | B | A | B | A |
| | | 500 mm/s | B | A | B | A | B | A |

| Comparative Example 3 | | | Example 4 | | | | | |
|---|---|---|---|---|---|---|---|---|
| No Demagnetization | | | 1000 | | 2000 | | 3000 | |
| Insulating Properties | Connection Resistance | Demagnetization Rate | Insulating Properties | Connection Resistance | Insulating Properties | Connection Resistance | Insulating Properties | Connection Resistance |
| C | A | 0.1 mm/s | A | A | A | A | A | A |
| | | 1.0 mm/s | A | A | A | A | A | A |
| | | 10 mm/s | A | A | A | A | A | A |
| | | 50 mm/s | A | A | A | A | A | A |
| | | 100 mm/s | A | A | A | A | B | A |
| | | 300 mm/s | B | A | B | A | B | A |
| | | 500 mm/s | B | A | B | A | B | A |

Number of films: constant (1), amount of phosphorus: constant (4%), varied demagnetization rates were used in Example 4

Overall Evaluation of Example 4 and Comparative Example 3

In Comparative Example 3 in which the non-demagnetized conductive film was used, the results of evaluation of the insulating properties were "C". However, in Example 4 in which the conductive particles in the anisotropic conductive films were demagnetized, the results of evaluation of the insulating properties for varied demagnetization were basically "A" or "B". As can be seen from these results, in the film-like anisotropic conductive adhesives and connection structures of the present invention, the conductive particles being magnetic powder used were efficiently demagnetized, and favorable connection reliability and insulation reliability were achieved. Findings about the tendency of demagnetization conditions will next be described.

<Evaluation of Insulating Properties>
(1) For Varied Demagnetization Rates

As can be seen from TABLE 4, as the demagnetization rate increases, the insulating properties tend to deteriorate. However, the degree of deterioration is not large. The results of the optical microscopic observation showed that aggregation of the conductive particles was observed in a place at which a "short circuit" had occurred.

<Evaluation of Connection Resistance>

When demagnetization was not performed, the connection resistance value was low. It is desirable that, even when demagnetization is performed, an increase in the connection resistance value do not occur. As can be seen from the column of "connection resistance" in TABLE 4, a preferred connection resistance value could be maintained even when the demagnetization rate was changed. When the amount of phosphorus was changed, the same tendency as in TABLE 2 was observed.

INDUSTRIAL APPLICABILITY

The anisotropic conductive adhesive of the present invention uses, as conductive particles, a magnetic powder at least partially composed of a magnetic material. The magnetic powder is demagnetized before the anisotropic conductive adhesive is used to establish an anisotropic conductive connection. Therefore, aggregation of the conductive particles can be prevented or significantly suppressed during anisotropic conductive connection. The anisotropic conductive adhesive is useful for anisotropic conductive connection between an electric element and a circuit board.

REFERENCE SIGNS LIST 1, 21 magnetic conductive particle
2, 23 container
2a, 32 opening
3 pressing means
10 demagnetization coil
22 liquid
31 paste
33 container
41 non-magnetic base
42 anisotropic conductive film
43 non-magnetic cover

The invention claimed is:

1. An anisotropic conductive adhesive in a form of a film comprising:
    an insulating adhesive composition comprising a thermosetting binder; and
    demagnetized magnetic conductive particles dispersed in the insulating adhesive composition, wherein the demagnetized magnetic conductive particles have an average particle diameter of from 0.5 μm to 30 μm, wherein the magnetic conductive particles are subjected to demagnetization before establishment of an anisotropic conductive connection using the anisotropic conductive adhesive film, and wherein the demagnetized magnetic conductive particles have a diameter that is less than a thickness of the film.

2. The anisotropic conductive adhesive film according to claim 1, wherein the demagnetization has been performed on the magnetic conductive particles (1) in a powder form that have not been dispersed in the insulating adhesive composition, (2) in a paste obtained by dispersing the magnetic conductive particles in the insulating adhesive composition, or (3) in the film before establishment of the anisotropic conductive connection.

3. The anisotropic conductive adhesive film according to claim 1, wherein the conductive particles are nickel-coated resin particles or nickel metal particles.

4. The anisotropic conductive adhesive film according to claim 3, wherein nickel in the nickel-coated resin particles contains elemental phosphorus.

5. The anisotropic conductive adhesive film according to claim 4, wherein the nickel in the nickel-coated resin particles contains 1 to 10% by mass of the elemental phosphorus.

6. The anisotropic conductive adhesive film according to claim 1, wherein the average particle diameter of the conductive particles is 0.5 to 30 μm.

7. The anisotropic conductive adhesive film according to claim 1, wherein the demagnetization has been performed on the magnetic conductive particles in a powder form filled into a container.

8. The anisotropic conductive adhesive film according to claim 1, wherein the demagnetization has been performed on the magnetic conductive particles in a powder form obtained by adding the magnetic conductive particles to a liquid and solidifying the liquid to temporarily fix the magnetic conductive particles in the solidified liquid.

9. The anisotropic conductive adhesive film according to claim 1, wherein the demagnetization has been performed on the magnetic conductive particles in a paste obtained by dispersing the magnetic conductive particles in the insulating adhesive composition.

10. The anisotropic conductive adhesive film according to claim 1, wherein the demagnetization has been performed on the magnetic conductive particles in the film obtained by dispersing the magnetic conductive particles in the insulating adhesive composition to form a dispersion and forming the dispersion into the film.

11. The anisotropic conductive adhesive film according to claim 1, wherein the demagnetization of the magnetic conductive particles has been performed at a magnetic field intensity of 200 to 2,000 G.

12. A method of producing the anisotropic conductive adhesive film according to claim 1 including the insulating adhesive composition and the magnetic conductive particles dispersed therein, the method comprising demagnetizing the magnetic conductive particles before the anisotropic conductive adhesive film is used to establish an anisotropic conductive connection.

13. A connection structure comprising a first electronic component having a terminal, a second electronic component having a terminal, and the anisotropic conductive adhesive film according to claim 1, wherein an anisotropic conductive connection between the terminal of the first electronic component and the terminal of the second electronic component has been established using the anisotropic conductive adhesive film.

14. A method of producing a connection structure in which a terminal of a first electronic component and a terminal of a second electronic component has been connected, the method comprising: disposing the anisotropic conductive adhesive film according to claim 1 between the terminal of the first electronic component and the terminal of the second electronic component; and pressing the first electronic component against the second electronic component while the anisotropic conductive adhesive film is heated to thereby establish an anisotropic conductive connection between the terminals.

* * * * *